United States Patent
Quiquempoix et al.

(10) Patent No.: US 6,788,233 B1
(45) Date of Patent: Sep. 7, 2004

(54) DIGITAL DECIMATION FILTER

(75) Inventors: Vincent Quiquempoix, Divonne-les-Bains (FR); Gabriele Bellini, Froideville (CH); Jerry Collings, Santa Clara, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 10/642,420

(22) Filed: Aug. 15, 2003

(51) Int. Cl.[7] .................................................. H03M 3/00
(52) U.S. Cl. .................................................. 341/143
(58) Field of Search ............................ 341/143, 155, 341/159; 708/313

(56) References Cited

U.S. PATENT DOCUMENTS 4,999,798 A * 3/1991 McCaslin et al. ........... 708/313

* cited by examiner

Primary Examiner—Brian Young
(74) Attorney, Agent, or Firm—Baker Botts L.L.P.

(57) ABSTRACT

A digital decimation filter with programmable frequency notches is disclosed. The digital decimation filter performs integration, differentiation, and scaling to produce a filtered output signal. The differentiation is preformed by a programmable counter. The filter has a control unit that controls the behavior of the filter. The control unit has registers to contain ther values of the frequency notches of the filter. The control unit activates the differentiator based on the value of the frequency notches in order to achieve filtration. The scaling unit uses a register, a bit shifter, and an adder to minimize complexity. The digital decimation filter provides high rejection with low complexity.

18 Claims, 5 Drawing Sheets

DIGITAL DECIMATION FILTER

FIELD OF THE INVENTION

The present invention relates generally to digital filters. More specifically, the present invention relates to digital decimation filters.

BACKGROUND OF THE INVENTION TECHNOLOGY

Delta-sigma analog to digital (A/D) converters are popular in a variety of applications including telecommunications, test equipment, and sound reproduction. In general, delta-sigma A/D converters have a delta modulator and a summation unit. The delta modulator of a delta-sigma A/D converter generates a digital signal based on the difference between an input voltage and a reference voltage.

The summation unit of a delta-sigma A/D converter consists of a counter to summate the pulses generated by the delta modulator. The summation unit is reset every A/D cycle. The output of the counter is latched at the end of every A/D cycle.

The summation unit may also be implemented using a digital low-pass filter followed by a decimator to lower the sampling rate. See J. C. Candy, *Decimation for Sigma-Delta Modulation*, IEEE Transactions on Communications, vol. 34, pp. 72–76 (January 1986). A sinc (or comb) filter may be used to perform this filtration and decimation. The sinc filter is a low-pass, finite impulse response (FIR) decimation filter. The sinc filter has the transfer function:

$$H(z) = \left(\frac{1}{M}(1 + z^{-1} + \ldots + z^{-(M-1)})\right)^L = \left(\frac{1 - z^{-M}}{M(1 - z^{-1})}\right)^L,$$

where L is the order of the sinc filter and M is the oversampling ratio of the sinc filter. Functionally, the sinc filter takes a moving average of the input over time.

One implementation of the sinc filter known as the Hogenaur structure is illustrated in FIG. 1. A Hogenaur structure sinc filter consists of a series of cascaded accumulators followed by a series of cascaded differentiators and a scaling factor which is just a shift. See E. B. Hogenauer, *An Economical Class of Digital Filters for Decimation and Interpolation*, IEEE Transactions on Acoustics, Speech, and Signal Processing, Vol. ASSP-29(2), pp. 155–162 (April 1981). Resampling at the lower (Nyquist) frequency is performed between the differentiators and the integrators. See id. This resampling allows the integrators to operate at a higher frequency, providing the M (oversampling) factor in the numerator of the transfer function, while the differentiators operate at a lower frequency. See id.

A Lth order sinc filter has M packets of L zeros located at the same position in the frequency domain, and each packet is separated by the Nyquist frequency. See id. For example, FIG. 1A shows the frequency response of a sinc filter where M=32, L=4, and the Nyquist frequency fs=60 Hz. The illustrated sinc filter has 32 packets of 4 zeros at multiples of 60 Hz.

In a sinc filter, the position of the frequency notches is dependant on the frequency of the oscillator. However, the frequency of oscillators may vary with temperature and supply voltage. There are a number of methods to deal with or compensate for this dependence on the frequency of the oscillator.

One technique to create a stable sinc filter over a wide range of temperatures and supply voltages is to build an oscillator with the desired precision over the fill range of temperatures and supply voltages. See LinearTech, LTC 2400 Datasheet (2001).

A second technique is to use a combination of different types of filters (i.e. multi-stage filters) for greater efficiency. In one example of this technique, a simple comb filter is used in the front-end at the higher rate. The comb filter is followed by half-band FIR or infinite impulse response (IIR) filters that are more complex than the comb filter, but where the sampling rate is lower. A digital signal processor (DSP) is commonly used to implement the more complex FIR filters, giving them very sharp frequency notches. See Steven R. Norsworthy, Richard Schreir, and Gabor C. Temes, Delta-Sigma Data Converters Theory, Design and Simulation (IEEE Press 1997).

A third technique is to modify the transfer function of the sinc filter by adding a little perturbation so that the filter creates frequency notches wider than the simple sinc filter. In one example of this technique, a perturbation is added in the accumulations preformed by the filter so that its coefficients are slightly different than the original ones. Therefore, the zeros are slightly moved and staggered. See Letzia Lo Presti, Efficient Modified-Sinc Filters for Sigma-Delta A/D Converters, Analog and Digital Processing, vol. 47, no. 11 (November 2000).

SUMMARY OF THE INVENTION

In accordance with the teachings of the present invention, a digital decimation filter including an integrator, a differentiator, a scaling unit, and a control unit is provided. In an exemplary embodiment of the invention, the integrator is adapted to receive an input signal where the input signal includes one or more frequency components. The differentiator is coupled to the integrator and includes a programmable counter. The scaling unit is coupled to the differentiator and is adapted to produce an output signal. The control unit is preferably coupled to the integrator, the differentiator, and the scaling unit. The control unit is preferably adapted to store one or more programmable frequency notches, wherein the control unit activates the programmable counter such that the output signal is a filtered version of the input signal where the frequency components corresponding to the programmable frequency notches are attenuated.

In another exemplary embodiment of the present invention, the programmable counter is adapted to perform a function based on the input and a value stored in the differentiator, in response to a signal from the control unit. Preferably, the programmable counter performs a differentiation.

In another exemplary embodiment of the present invention, the control unit includes one or more registers and each register is adapted to store a value representing a frequency notch of the digital decimation filter. Preferably, the control unit includes a data bus coupled to the registers which is operable to load values from or store values to the registers. Preferably, the control unit includes a counter having a current value and one or more comparators, where each comparator is adapted to compare the value stored in one of the registers with the current value of the counter.

In another exemplary embodiment of the present invention, the scaling unit includes a register, a shifter, and an adder. The register has an input adapted to receive data from the differentiator and an output. The shifter has an input adapted to receive data from the register, an output, and a binary value. The shifter is operable to shift the binary value. The adder has a first input adapted to receive data from the shifter and an output.

In another aspect, the present invention provides a method of filtering a signal. An example of the method includes integrating the signal to produce an integrated signal and selectively differentiating the integrated signal using a programmable counter to produce a differentiated signal, and resampling the integrated signal at a frequency lower than a clock frequency. The integrated signal is differentiated according to one or more programmable frequency notches. This exemplary method preferably includes comparing a current value with one or more stored frequency notch values and performing the differentiation if the current value is equal to a stored frequency notch value. This exemplary method preferably includes scaling the differentiated signal so that the filter achieves a desired gain for a DC signal. The exemplary method preferably accomplishes the scaling using a register, a shifter, and an adder. The exemplary method preferably substantially achieves a gain of 0 dB for DC signals.

In another aspect, the present invention provides a delta-sigma analog-to-digital (A/D) converter. An exemplary embodiment of the converter includes a digital decimation filter. The digital decimation filter is adapted to receive an input and produce an output The digital decimation filter includes an integrator and a differentiator coupled together. The differentiator includes a programmable counter that is adapted to selectively differentiate an input signal according to one or more programmable frequency notches. The exemplary converter preferably includes a plurality of registers. Each register is adapted to store a value of a frequency notch of the digital decimation filter. The exemplary converter preferably includes a counter and a plurality of comparators. The counter has a current value. Each of the plurality of comparators is operable to compare the value of respective ones of the registers with the current value of the counter and produce an output based on the comparison. The exemplary comparator preferably includes a scaling unit. The scaling unit is operable to receive a signal from the differentiator as an input and produce an output, where the output is a scaled version of the input. Preferably, the scaling unit has a 0 dB gain when a DC signal is input to the converter. The scaling unit preferably includes a programmable shifter operable to shift data bitwise left or right.

In another aspect, the present invention provides a signal processing apparatus including a digital decimation filter. In one exemplary embodiment of the invention, the digital decimation filter includes an integrator, a differentiator, a control unit, and a scaling unit. The integrator is coupled to the differentiator. The differentiator is coupled to the scaling unit. The control unit is coupled to the integrator, the differentiator, and the scaling unit. The differentiator includes a programmable counter. Preferably, the signal processing apparatus includes an input signal that has one or more frequency components and the control unit has one or more frequency notches. In an exemplary embodiment of the signal processing apparatus, the control unit activates the differentiator such that the digital decimation filter attenuates the frequency component corresponding to one of the frequency notches.

Features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein.

Figure 1:
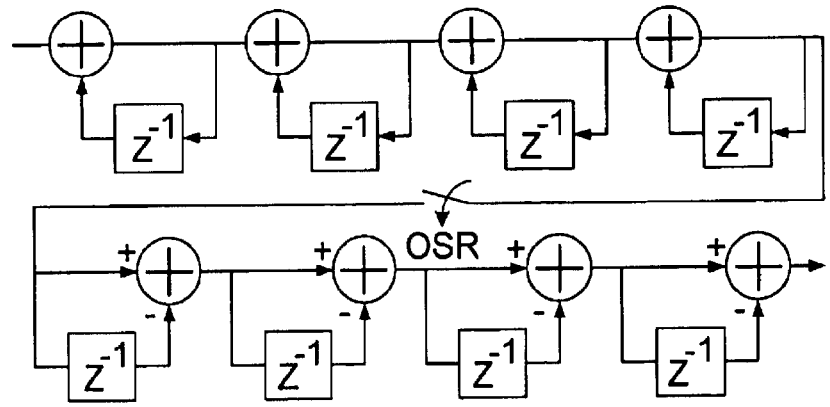
FIG. 1 is a block diagram of a prior art Hogenaur structure sinc filter.
Figure 1A:
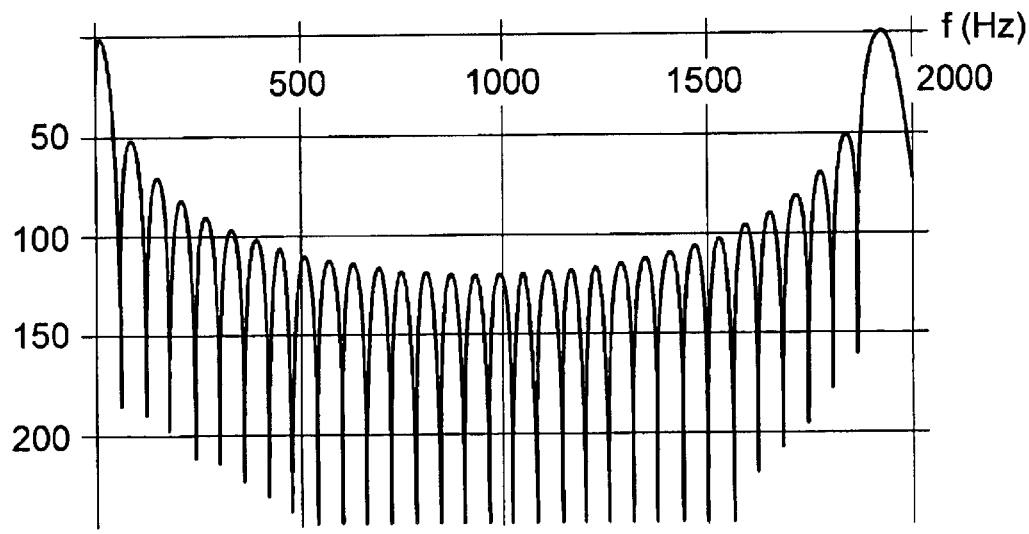
FIG. 1A is a plot of the frequency response of a sinc filter.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention is directed to providing a digital decimation filter using a programmable counter. It is a further aspect of the present invention to provide a filter with staggered zeros, high rejection capability, and widened frequency notches. Preferably, the present invention will provide a rejection of 120 dB at 50 Hz or 60 Hz over a full range of temperature and supply voltages. One implementation of the present invention provides a decimation filter with low complexity and low power consumption.

The transfer function of an exemplary embodiment of the present invention may be expressed as:

$$H(z) = \frac{1}{\prod_{k=1}^{L} M_k} \frac{\prod_{k=1}^{L}(1 - z^{-M_k})}{(1 - z^{-1})^L} = \prod_{k=1}^{L}\left(\frac{1 - z^{-M_k}}{M_k(1 - z^{-1})}\right),$$

where L is the order of the filter and $M_k$ represent the positions of the notches of the filter.

Referring now to the drawings, the details of an exemplary embodiment of the present invention is schematically illustrated. Like elements in the drawings will be represented by like numbers.

Figure 2:
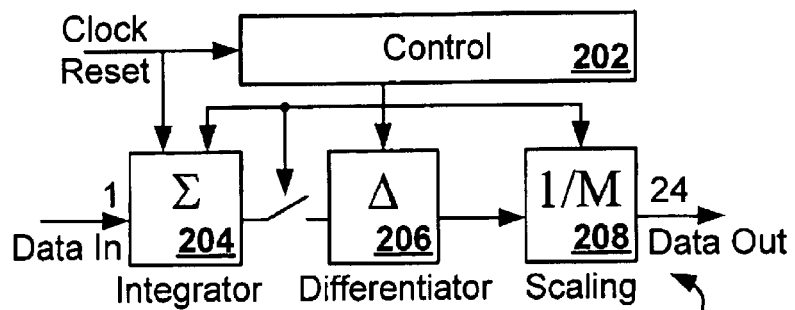
FIG. 2 is a block diagram of a digital decimation filter, according an exemplary embodiment of the present invention.

Referring to FIG. 2, depicted is a block diagram of an exemplary embodiment of the present invention. A filter, generally represented by the numeral 200 comprises an integrator 204; a differentiator 206 connected to an output of the integrator 204; a scaling unit 208 connected to an output of the differentiator 206; and a control unit 202 connected to the integrator 204, the differentiator 206, and the scaling unit 208.

Integrator

Figure 4:
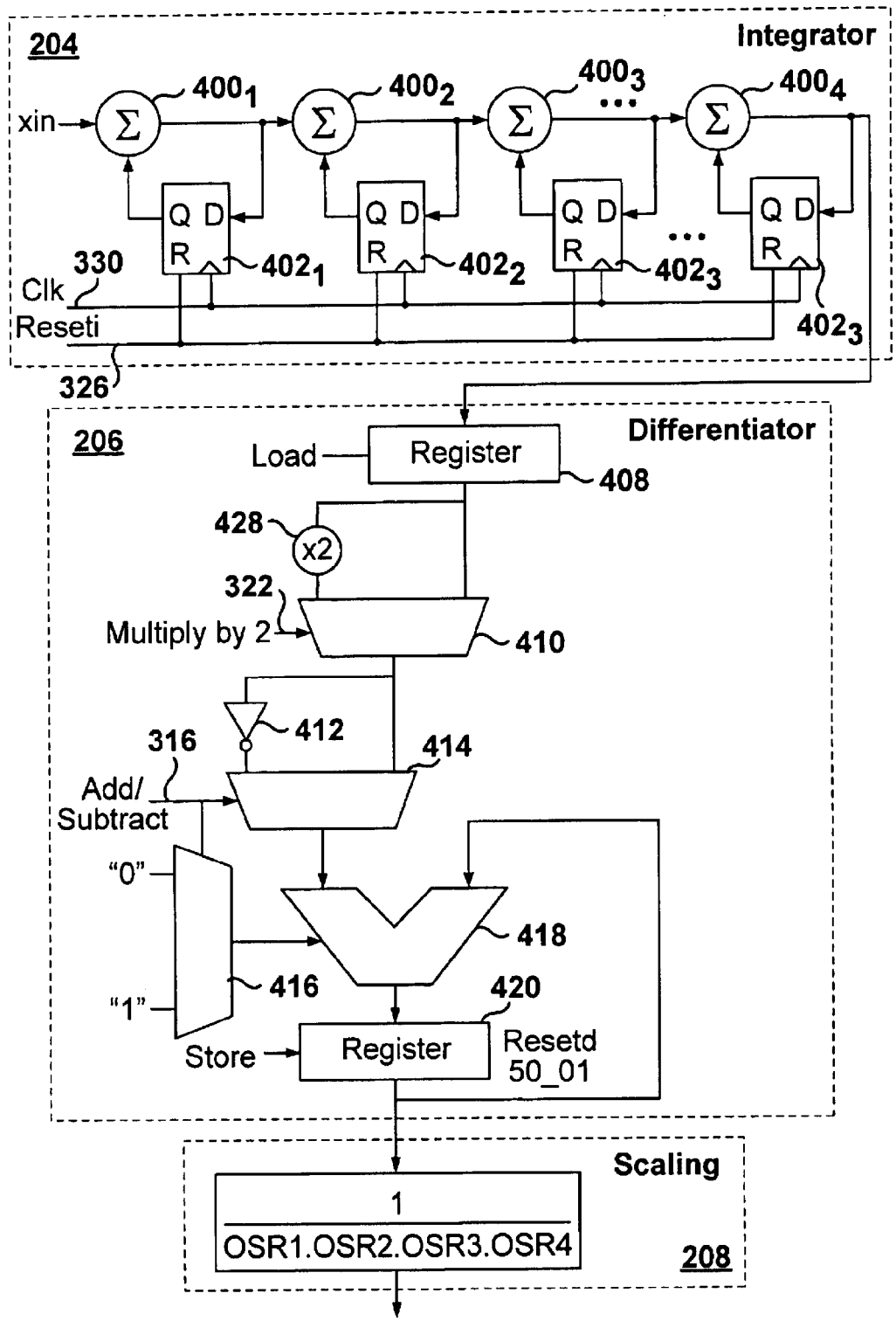
FIG. 4 is a block diagram of portions of a digital decimation filter, according an exemplary embodiment of the present invention.

Referring to FIG. 4, depicted is a block diagram of an exemplary embodiment of the filter 200. The integrator, represented generally by the numeral 204, comprises one or more accumulators $400_{1..L}$ and one or more registers of registers $402_{1..L}$.

The integrator has a transfer function $H_{int}(z)$. An exemplary embodiment of the integrator has the transfer function:

$$H_{int}(z) = \left(\frac{1}{1-z^{-1}}\right)^L,$$

where L is an order of the integrator, or the number of accumulators $400_{1..L}$ and registers $402_{1..L}$.

Each of the accumulators $400_{1..L}$ has an input and an output. The output of each accumulator $400_{1..L-1}$ is connected to the input of the following accumulator $400_{2..L}$. The output of the final accumulator $400_{1..L}$ is connected to an input of the differentiator 206.

Each of the registers $402_{1..L}$ has a load line (D), a store line (Q), a reset line (R), and a clock line. The load line (D) is connected to the output of the associated accumulator $400_{1..L}$. The store line (Q) is connected to the input of the associated accumulator $400_{1..L}$. The reset lines of the registers are tied to a reset integrator (reseti) line 326. When the reset integrator (reseti) line 326 is engaged the values stored in the registers $402_{1..L}$ are erased. The clock lines of the registers are tied to a clock (clk) line 330. An oscillator (not shown) generates a signal on the clock (clk) line 404.

In the integrator 204, the registers $402_{1..L}$ may become progressively wider, that is, able to store larger numbers, as L increases.

In the integrator 204, the registers $402_{1..L}$ may be truncated. This truncation may allow the use of narrower registers in the differentiator 206 and the scaling unit 208. In such a filter, the truncation may be accounted for in the calculation of the numerical error made by the filter. The truncation may be correlated with the desired output data precision.

Differentiator

The filter 200 includes the differentiator 206 to differentiate the output of the integrator 204. The differentiator 206 has a transfer function $H_d(z)$. In an example system the transfer function is:

$$H_d(z) = \prod_{k=1}^{L}(1 - z^{-M_k}) = 1 - \sum_{k=1}^{L} z^{-M_k} + \ldots + (-1)^L z^{-(\Sigma_{k=1}^{L} M_k)},$$

where L is the order of the differentiator 206 and each factor $M_k$ may be different. If the system has different $M_k$ factors it will have different zeros or frequency notches. If the frequency notches are spaced close to each other, the differentiator 206 may have wider bands of attenuation than a differentiator with all of its frequency notches at the same location.

Referring again to FIG. 4, depicted is a block diagram of an exemplary embodiment of portions of the filter 200. The differentiator, generally represented by the numeral 206, comprises a first register 408, a doubler 428, a first multiplexer 410, an inverter 412, a second multiplexer 414, a third multiplexer 416, an add/subtract unit 418, and a second register 420.

The first register 408, has an input and an output, connected to the output of the integrator 204. The example differentiator 206 includes a doubler 428 having an input connected to register 408 and an output. The output of doubler 428 is the output of the first register 408 that is multiplied by two (doubled). The doubler 428 may be a multiplier or an adder with its inputs tied together.

The first multiplexer 410 includes a first input connected to the output of register 408, a second input connected to the output of doubler 428, a control line connected to a multiply by 2 line 322, and an output. The first multiplexer 410 selects one of the inputs based on the value of the multiply by 2 line 322 and expresses the value of the selected input on the output.

The inverter 412 has an input connected to the output of multiplexer 410 and an output. The inverter 412 may be a group of not gates or some other configuration based on how numbers are represented in the system.

The second multiplexer 414 has a first input connected to the output of inverter 412, a second input connected to the output of the first multiplexer 410, a control line connected to an add/subtract line 318, and an output. The second multiplexer 414 selects one of the inputs based on the value of the add/subtract line 318 and expresses the value of the selected input on the output.

The third multiplexer 416 has a first input connected to a logic "0", a second input connected to a logic "1", a control line connected to an add/subtract line 318, and an output. The third multiplexer 416 selects one of the inputs based on the value of the add/subtract line 318 and expresses the value of the selected input on the output.

The add/subtract unit 418 has a first input connected to the output of the second multiplexer 414, a second input connected to the output of the second register 420, a control line connected to the output of multiplexer 416, and an output stored in register 420. The add/subtract unit 418 adds or subtracts the values of the inputs based on the value on the control line.

The second register 420 has an input and an output. The input is connected to add/subtract unit 418. The output is connected to one input of the add/subtract unit 418. The output is also connected to the scaling unit 208. The second register 420 has a store line. The second register 420 has a reset differentiator (resetd) line 328. When the reset differentiator (resetd) line 328 is engaged, the value store in register 420 is set to 0001.

An advantage of the present invention is the use of a programmable counter in the differentiator 206, allowing the placement of the frequency notches of the filter 200.

Scaling Unit

The scaling unit 208 permits the filter to have a substantially 0 dB gain for DC signals. In one example filter the scaling unit 208 has a transfer function described by the equation:

$$H_s(z) = \frac{1}{\prod_{k=1}^{L} M_k},$$

where L is the order of the filter and the $M_k$ factors represent the frequency notches of the filter. The scaling unit 208 with this transfer function may be implemented using a divider or a multiplier.

The frequency notches of the filter (represented by the $M_k$ factors in the transfer function) may be close to each other and spaced about an oversampling ratio (M) of the modulator. The transfer function of the scaling unit may be expressed as the distance of the $M_k$ factors from M, as follows:

$$H_s(z) = \frac{1}{M^L \prod_{k=1}^{L}\left(1 - \frac{x_k}{M}\right)},$$

where $x_k = M_k - M$. The scaling unit 208 with this transfer function may be implemented using a multiplier or divider. If the $x_k$ factors are small, the transfer function may be expressed in a Taylor series.

In an exemplary embodiment of the scaling unit 208 the $x_k$ terms may be symmetrical (e.g. $x_1 = -x_2$). In other exemplary embodiments of the scaling unit 208 the $x_k$ terms may be even (e.g., $x_1 = -x_2$) or odd (e.g., $x_3 = -x_4$). In an yet another exemplary embodiment of the scaling unit 208 the $x_k$ terms are powers of two (e.g., 0, 1, 2, 4, 8, ...), permitting the use of one or more shifters in place of full multipliers. The number of shifters may be based on the desired precision of the filter.

Figure 5:
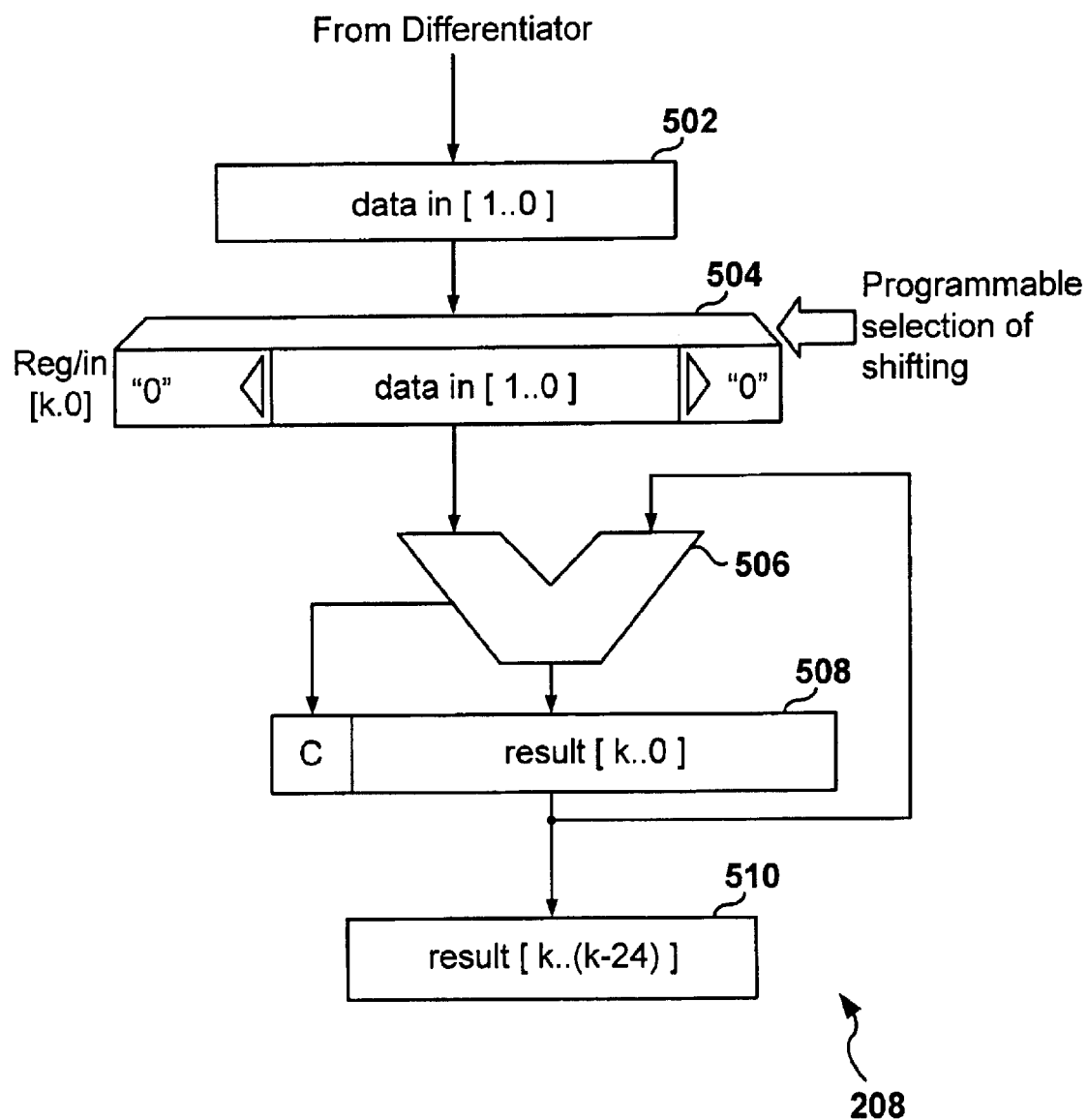
FIG. 5 is a block diagram of a scaling unit, according an exemplary embodiment of the present invention.

Referring to FIG. 5, depicted is a block diagram of an exemplary embodiment of the scaling unit 208. The scaling unit, generally represented by the numeral 208, comprises blocks 502–510. The scaling unit 208 receives data from the differentiator (block 502). The scaling unit 208 shifts the data based on the value of $M_k$ (block 504). The scaling unit 208 has an accumulator 506 that accumulates an intermediate result 508. The scaling unit 208 produces a final result 510.

An advantage of the present invention is the ability to use a shifter in place of a full multiplier to scale the signal.

Control Unit

Figure 3:
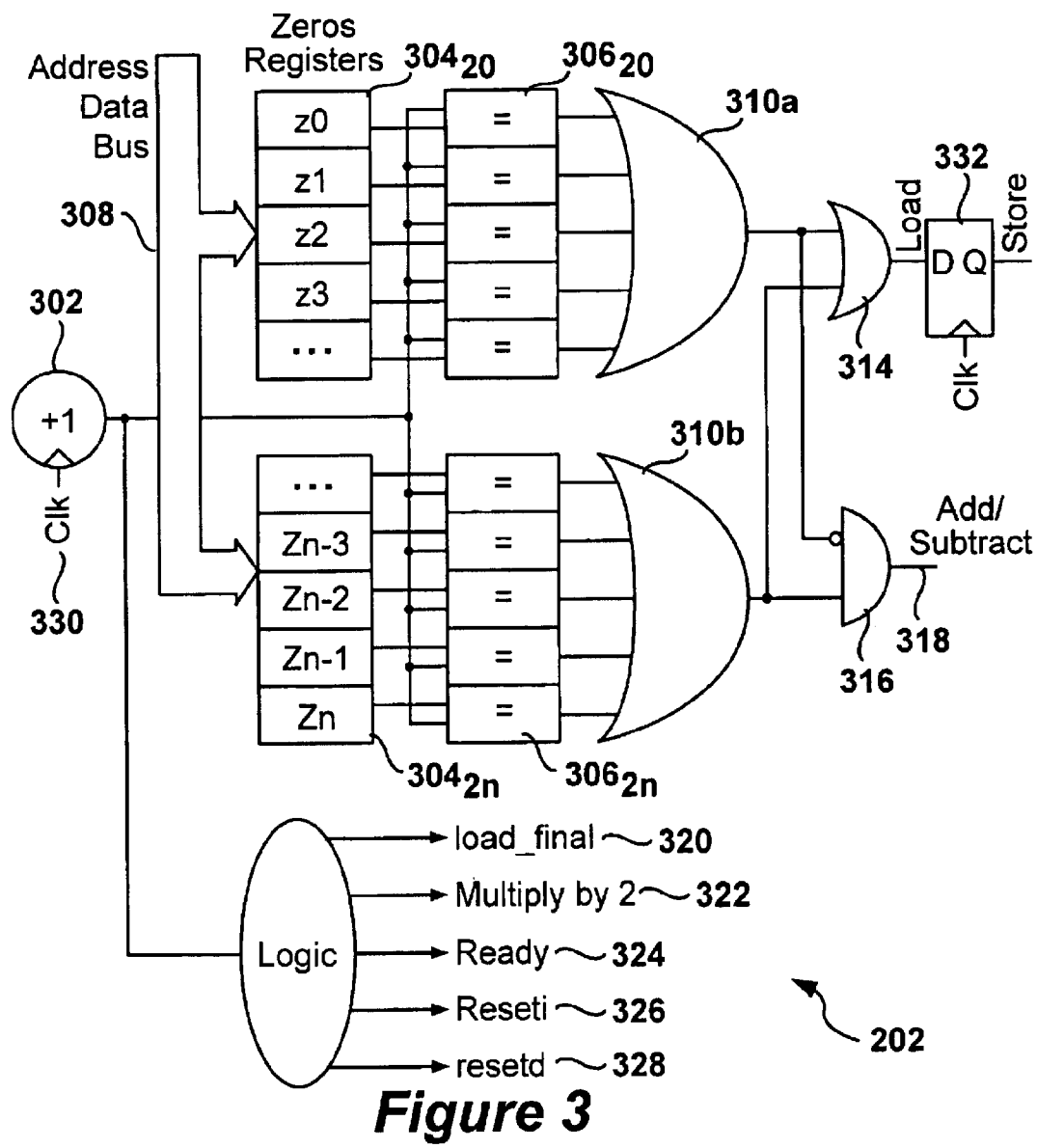
FIG. 3 is a block diagram of a control unit, according an exemplary embodiment of the present invention.

The control unit 202 generates and synchronizes signals for the filter. Referring to FIG. 3, depicted is a block diagram of an exemplary embodiment of control unit 202. The control unit, represented generally by the numeral 202, comprises an accumulator 302, one or more registers $304_{z0..zn}$, one or more comparators $306_{z0..zn}$, a first OR gate 310A, an address/data bus 308, a second OR gate 310B, a third OR gate 314, an AND gate 316, an add/subtract line 318, a load_final line 320, a multiply by 2 line 322, a ready line 324, a reset integrator (reseti) line 326, a reset differentiator (resetd) line 328, and a clock (clk) line 330.

Counter 302 has a current value that is incremented by clock (clk) line 330. The counter 302 may be implemented using an accumulator having a register and an adder.

The registers $304_{z0..zn}$, store the position of the $M_k$ factors (representing the frequency notches of the filter). The registers $304_{z0..zn}$ may be divided into two or more groups, based on the development of the transfer function of the filter. The number of registers $304_{z0..zn}$ is based on the number of coefficients in the transfer function of the filter. The number of registers $304_{z0..zn}$ may be varied based on the desired precision of the filter. Values may be loaded from or stored to the registers $304_{z0..zn}$ using address/data bus 308. The filter may have an additional I/O unit or a ROM to read the values of the $M_k$ factors stored in the registers $304_{z0..zn}$.

The comparators $306_{z0..zn}$ that determine if the current counter value is equal to the value stored in one of the registers $304_{z0..zn}$. In one example, there are two groups of comparators $306_{z0..zn}$, first group for the group of registers $304_{z0..zn}$ representing the even terms and a second group for the group of registers $304_{z0..zn}$ representing the odd terms.

Based on the values of the $M_k$ factors stored in the registers $304_{z0..zn}$ and the current value of the counter 302, the control unit 202 may cause the integrator 204 to active a load line (D) of a register 332. In one example of the control unit 202, an OR gate 310A enters a logic "1" state if any of the even $M_k$ factors are equal to the value of the counter 302 and an OR gate 310B enters a logic "1" state if any of the odd $M_k$ factors are equal to the value of the counter 302. In this example, AND gate 316 causes the add/subtract line 318 to enter a logic "1" state if OR gate 310B is in a logic "1" state and OR gate 310A is in a logic "0" state. In this example control unit 202, if OR gate 310A or OR gate 310B are in a logic "1" state, then OR gate 314 enters a logic "1" state and engages the load line (D) of register 332.

The control unit 202 may send other signals to the filter. For example the control unit 202 may have logic that determines when to engage: load_final line 320; multiply by 2 line 322, as described with respect to FIG. 4; ready line 322; reset integer (reseti) line 326, as described with respect to FIG. 4; reset differentiator (resetd) line 328, as described with respect to FIG. 4.

An advantage of the present invention is the use of the registers $304_{z0..zn}$ to control the placement of the frequency notches of the filter.

Figure 6:
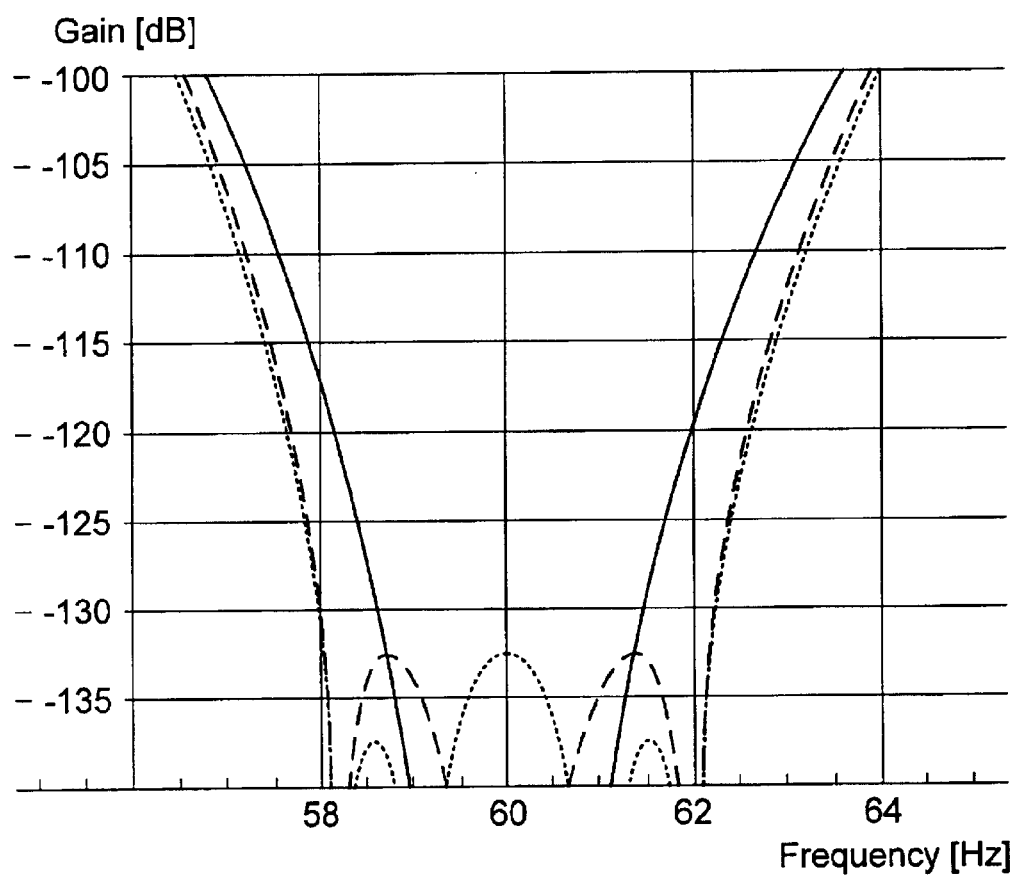
FIG. 6 is a plot of the frequency response of a digital decimation filter, according an exemplary embodiment of the present invention.

Referring to FIG. 6, depicted is a plot of the frequency response of an exemplary embodiment of the digital decimation filter.

The digital filter described above may be implemented as a stand-alone component or as part of an integrated package. In one example, the filter may be used in a DSP device. In another example, the filter may be implemented as part of a delta-sigma A/D converter. The delta-sigma A/D converter may be used as a stand-alone device or integrated into a system. For example, the delta-sigma A/D converter may be used in test equipment (e.g. a digital volt meter), communications equipment (e.g. a receiver, a transmitter, a modulator, a demodulator), audio equipment, or any other system where analog to digital conversion is used.

The invention, therefore, is well adapted to attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A digital decimation filter, including:
   a programmable power supply for supplying power to electronic circuits of electronic equipment;
   a integrator adapted to receive an input signal, the input signal including one or more frequency components;
   a differentiator coupled to the integrator, the differentiator including a programmable counter;
   a scaling unit coupled to the differentiator, the scaling unit adapted to produce an output signal; and
   a control unit coupled to the integrator, the differentiator, and the scaling unit, the control unit adapted to store one or more programmable frequency notches, wherein the control unit activates the programmable counter such that the output signal is a filtered version of the input signal wherein the frequency components corresponding to the programmable frequency notches are attenuated.

2. The digital decimation filter of claim 1, wherein the programmable counter is adapted to perform a function based on the input and a value stored in the differentiator, responsive to a signal from the control unit.

3. The digital decimation filter of claim 2, wherein the function preformed by the programmable counter is a differentiation.

4. The digital decimation filter of claim 1, wherein the control unit includes one or more registers, each register adapted to store a value, the value representing one of the programmable frequency notches.

5. The digital decimation filter of claim 4, wherein the control unit further includes a data bus coupled to the registers, the data bus operable to load values from the registers or store values to the registers.

6. The digital decimation filter of claim 4, wherein the control unit further includes:
   a counter having a current value; and
   one or more comparators, each comparator coupled to the counter and to one of the registers, each comparator operable to compare the value stored in one of the registers with the current value and produce an output, the output indicating whether the value stored in the register and the current value are equivalent.

7. The digital decimation filter of claim 1, wherein the scaling unit includes:
   a register, having an input adapted to receive data from the differentiator and an output;
   a shifter coupled to the register, the shifter including a binary value, wherein the shifter is operable to shift the binary value; and
   an adder coupled to the shifter, the adder adapted to produce an output.

8. The method of filtering a signal, including:
   integrating the signal to produce an integrated signal;
   selectively differentiating the integrated signal using a programmable counter to produce a differentiated signal, wherein the integrated signal is differentiated according to one or more programmable frequency notches;
   scaling the differentiated signal to achieve a desired gain for a DC signal; and
   resampling the integrated signal at a frequency lower than a clock frequency.

9. The method of claim 8, further including:
   comparing a current value with one or more stored frequency notches; and
   performing the differentiation if the current value is equal to a programmable frequency notches.

10. The method of claim 8, wherein the desired gain is substantially 0 dB.

11. The method of claim 8, wherein the scaling is accomplished using a register, a shifter, and an add/subtract unit.

12. The method of claim 8, wherein the differentiation includes:
   loading a first value from a first register;
   selectively multiplying the first value by two;
   selectively adding or subtracting the first value and a second value to produce a third value; and storing the third value in a second register.

13. A delta-sigma analog-to-digital converter including:
   a digital decimation filter, the digital decimation filter adapted to receive an input and produce an output;
   wherein the digital decimation filter includes an integrator and a differentiator coupled together;
   wherein the differentiator includes a programmable counter;
   a scaling unit coupled to the differentiator, the scaling unit operable to produce an output signal, wherein the output signal is a scaled version of the input; and
   wherein the programmable counter is adapted to selectively differentiate an input signal according to one or more programmable frequency notches.

14. The delta-sigma analog-to-digital converter of claim 13, further including one or more registers adapted to store a programmable frequency notch.

15. The delta-sigma analog-to-digital converter of claim 14, further including:
   a counter having a current value;
   a plurality of comparators, each comparator coupled to one of the registers and the counter, wherein each comparator is operable to compare the value of one of the registers with the current value and produce an output.

16. The delta-sigma analog-to-digital converter of claim 13, wherein the scaling unit has a gain of substantially 0 dB when a DC signal is input to the delta-sigma analog-to-digital converter.

17. The delta-sigma analog-to-digital converter of claim 13, wherein the scaling unit includes a programmable shifter operable to shift data bitwise left or right.

18. A signal processing apparatus, including:

a integrator adapted to receive an input signal, the input signal including one or more frequency components;

a differentiator coupled to the integrator, the differentiator including a programmable counter;

a scaling unit coupled to the differentiator, the scaling unit adapted to produce an output signal; and a control unit coupled to the integrator, the differentiator, and the scaling unit, the control unit adapted to store one or more programmable frequency notches, wherein the control unit activates the programmable counter such that the output signal is a filtered version of the input signal wherein the frequency components corresponding to the programmable frequency notches are attenuated.

\* \* \* \* \*